United States Patent
Murayama et al.

(10) Patent No.: US 6,319,605 B1
(45) Date of Patent: Nov. 20, 2001

(54) HEAT-RESISTANT FIBER PAPER

(75) Inventors: Sadamitsu Murayama, Osaka; Michikage Matsui, Ibaraki, both of (JP)

(73) Assignee: Teijin Limited, Tokyo (JP)

( * ) Notice: Subject to any disclaimer, the term of this patent is extended or adjusted under 35 U.S.C. 154(b) by 0 days.

(21) Appl. No.: 09/147,630

(22) PCT Filed: May 28, 1998

(86) PCT No.: PCT/JP98/02352
§ 371 Date: Feb. 4, 1999
§ 102(e) Date: Feb. 4, 1999

(87) PCT Pub. No.: WO98/56987
PCT Pub. Date: Dec. 17, 1998

(30) Foreign Application Priority Data

Jun. 10, 1997 (JP) .................................................. 9-152360

(51) Int. Cl.$^7$ ...................................................... B32B 27/34
(52) U.S. Cl. ................... 428/395; 428/474.4; 428/423.5; 428/458; 428/537.5; 428/903
(58) Field of Search ............................... 428/421, 423.5, 428/425.1, 458, 463, 607, 626, 637, 212, 474.4, 480, 476.3, 537.5, 395, 903; 162/146, 156, 157.3

(56) References Cited

U.S. PATENT DOCUMENTS 3,756,908 * 9/1973 Gross et al. .......................... 162/146
4,035,694 * 7/1977 Barton et al. ........................ 361/400
4,698,267 * 10/1987 Tokarsky ............................ 428/474.4
4,729,921 * 3/1988 Tokarsky ............................... 428/288
4,888,091 12/1989 Nollen et al. ......................... 162/109
5,126,012 * 6/1992 Hendren et al. ...................... 162/146

FOREIGN PATENT DOCUMENTS

| 50-106 | * 1/1975 | (JP) . |
| 61-160500 | 7/1986 | (JP) . |
| 62-41400 | * 2/1987 | (JP) . |
| 2-236907 | 9/1990 | (JP) . |
| 4-6708 | 1/1992 | (JP) . |
| 4-257398 | * 9/1992 | (JP) . |
| 5-33289 | * 2/1993 | (JP) . |
| WO 92/05300 | 4/1992 | (WO) . |

* cited by examiner

*Primary Examiner*—Merrick Dixon
(74) *Attorney, Agent, or Firm*—Rader, Fishman & Grauer, PLLC

(57) ABSTRACT

A heat resistant fiber sheet composed of staple fibers consisting of a heat resistant organic high molecular polymer and fibrids consisting of a heat resistant organic high molecular polymer as main components, having excellent heat resistance, dimensional stability to heat, interlaminar peeling strength, electric insulation resistance under a high humidity, etc., and also good resin impregnating property in spite of having a high bulk density, and especially suitable for a base substrates for an electric insulating material and a laminate for an electric circuit, is obtained by setting the amount of the staple fibers occupying in the total amount of the sheet as 40 to 97% by weight and the amount of the fibrids as 3 to 60% by weight and partially softening and/or melting the fibrids so as to act as a binder.

14 Claims, No Drawings

HEAT-RESISTANT FIBER PAPER

TECHNICAL FIELD

The present invention relates to a heat resistant fiber sheet having excellent heat resistance and electrical insulating property under a high temperature and a high humidity, and suitably used as a laminate plate for an electric circuit board, and more particularly relates to a heat resistant fiber sheet composed of staple fibers consisting of a heat resistant organic high molecular polymer with fibrids consisting of a heat resistant organic high molecular polymer as main components.

BACKGROUND ARTS

As a base substrate used as a laminate plate for an electric circuit board, various characteristic properties such as a heat resistance, a dimensional stability against heat, a dimensional stability against humidity, an electrical insulating property, a deformation resistance (not easily form distortion, curling, corrugation, etc.), a light weight, etc., are required.

Since a heat resistant fiber sheet is excellent in several points such as a heat resistance, an electrical insulating property, a dimensional stability against heat, a light weight, etc., as compared with papers made from the other materials, recently, the heat resistant fiber sheet is becoming to be utilized as a base substrate for the laminate plate used for the electric circuit board.

For example, a sheet composed of staple fibers of a polymethaphenylene isophthalamide (Conex; made by Teijin Limted) with a pulp made of the polymethaphenylene isophthalamide (Japanese Unexamined Patent Publications No. 2-236907, 2-106840, etc.) and a heat resistant fiber sheet composed of a copolyparaphenylene/3, 4'-oxydiphenylene terephthalamide fiber (Technora; made by Teijin Limited) with an organic resinous binder (Japanese Unexamined Patent Publications No. 1-92233 and 2-47392), etc., were proposed.

However, since the former not only developed a dimensional change by a shrinkage caused by a heat treatment at a high temperature such as 250° C. or higher, but also an equilibrium water content (water content) of the fiber was large as 5 to 6%, and the content of impurity ions is also large, the paper was inferior in the electric insulating property and could not be used as the base substrate for the electrical insulation to which a high reliability is required.

On the other hand, although the latter had the small equilibrium water content and the impurity ion content thereof was also small since it used the organic resin as the binder composition, it had a problem that the binder migrated to the surface and back sides of the paper during the production processes and was unevenly distributed, and as a result, the amount of the binder existing at the middle layer portion of the paper became very small to deteriorate the uniformity thereof in the thickness direction and reliability of the above paper.

In the case of using such a heat resistant fiber sheet as a laminate plate for the base substrate of an electrical circuit board, since the sheet is subject to a prepreg-preparation step in which the sheet is impregnated with a varnish composition containing, for example, an epoxy resin, and dried, and a prepreg-lamination and shaping step. During the steps, the uneven distribution of the organic resinous binder causes the impregnation and adhesion of the varnish composition to become uneven, a portion of the binder to be fused so as to reduce the adhesion of the staple fibers to each other, and thus the sheet per se to be broken. Also, due to the uneven distribution of the resinous binder, the staple fibers unevenly move from each other and thus the distribution of the staple fibers in the sheet becomes uneven. Further, the resultant laminate for the electric circuit boards is sometimes deformed after a solder reflow step at a high temperature.

Also, a sheet obtained by mechanically binding a para-type aromatic polyamide staple fiber (Kevlar; made by Du Pont Co., Ltd.) and microfibers (Kevlar) of fibrilated para-type aromatic polyamide with a meta-type aromatic polyamide fibrids instead of using the organic resin as the binder, was also proposed (Japanese Unexamined Patent publication No. 61-160500 and Japanese Patent Publication No. 5-65640).

Although this sheet was excellent in characteristic properties such as the heat resistance, dimensional stability against heat, dimensional stability against humidity, deformation resistance (distortion, curling, corrugation, etc.), etc., there was a problem of frequently generating inferior products in electrical insulation tests performed under a high humidity, since the used fibrids were the meta-type aromatic polyamide and had a high equilibrium water content and a high impurity ion content.

That is because, since in the laminate for the electrical circuit board produced by using a base substrate having a large water absorption (equilibrium water content), a migration of the contained impurity ions is generated on passing electricity for a long period of time under a high humidity, an inferiority in the electrical insulation occurred and a reliability for a long period of time could not be maintained.

As described above, various heat resistant fiber sheets were proposed, but a paper base substrate for an electrical insulation material low in water absorption and impurity ion content, excellent in electrical insulating property and also uniformity in the thickness direction of the paper, having a good impregnating property to a varnish composition, and also excellent in bonding property among the laminated layers and deformation resistance, could not be realized yet.

SUMMARY OF THE INVENTION

An object of this invention is to provide a heat resistant fiber sheet having an excellent heat resistance, thermal dimensional stability, interlaminar peeling strength, superior electric insulation under a high humidity, and also a good resin impregnating property in spite of having a high bulk density and suitable as a base substrate for an electric insulation and for a laminate used for an electric circuit board.

The above-mentioned heat resistant fiber sheet is obtained by bonding one kind or two or more kinds of staple fibers consisting of a heat resistant organic high molecular polymer such as para-type aromatic polyamide staple fibers with fibrids consisting of an organic high molecular polymer acting as a binder in the paper making stage, forming a paper, and then partially softening and/or melting the fibrids consisting of the above organic high molecular polymer under a high temperature and a high pressure for strongly bonding the staple fibers constituting the paper with each other.

Thus, according to this invention, a heat resistant staple fiber sheet, comprising:

(A) 40 to 97% by weight of staple fibers consisting of a heat resistant organic high molecular polymer, and (B) 3 to 60% by weight of fibrids consisting of a heat resistant organic high molecular polymer, and incorporated into the staple fibers(A), wherein said fibrids(B) act as a binder by partially softened and/or melted, and, a process for producing a heat resistant staple fiber sheet, comprising:

an aqueous slurry uniformly dispersed with the staple fibers consisting of a heat resistant organic high molecular polymer and fibrids consisting of a heat resistant organic high molecular polymer is subjected to a wet type paper-forming process and drying, and the obtained dried paper is heated and pressed under a temperature of 220 to 400° C. and a pressure of 150 to 250 kg/cm² for partially softening and/or melting the said fibrid consisting of a heat resistant organic high molecular polymer; are provided.

DESCRIPTION OF THE PREFERRED EMBODIMENTS

A heat resistant fiber sheet in this invention includes a paper, a nonwoven fabric or a sheet composed of staple fibers consisting of a heat resistant organic high molecular polymer and fibrids consisting of a heat resistant organic high molecular polymer as main components, in which the fibrids consisting of the organic high molecular polymer act as a binder by partially softened and/or melted.

As the above staple fibers consisting of the organic high molecular weight polymer, aromatic polyamide staple fibers having a thermal decomposition initiating temperature of 330° C. or higher, staple fibers consisting of an aromatic polymer containing a heterocyclic ring, staple fibers consisting of a polyetherketone, etc., are cited, and among them, the aromatic polyamide staple fibers are preferable. Also, the above staple fibers may be used singly or by mixing 2 or more kinds together.

The above aromatic polyamide staple fibers are staple fibers composed of an aromatic homopolyamide or an aromatic copolyamide of which 80 mole % or more, preferably 90 mole % or more of a recurring unit constituting the polyamide, which is expressed by the following formula (I).

(I) —NH—Ar$_1$—NHCO—Ar$_2$—CO—

Wherein, Ar$_1$ and Ar$_2$ express each an aromatic group, and preferably a same or different aromatic groups selected from the following formulae (II), provided that the hydrogen atoms in the aromatic groups are allowed to be substituted with a halogen atom, a 1 to 3 C lower alkyl group, phenyl group, etc.

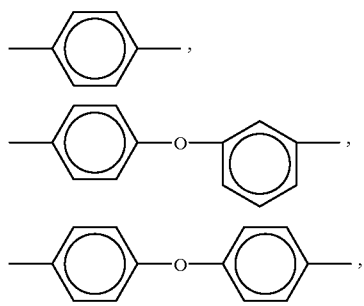

(II)

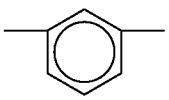

-continued

As for the method for producing such aromatic polyamide fibers and the characteristic properties of the fibers are described in, for example, U.K. Patent No. 1501948, U.S. Pat. Nos. 3,733,964, 3,767,756 and 3,869,429, and Japanese Unexamined Patent Publications No. 49-100322, No. 47-10863, No. 58-144152 and No. 4-65513, etc.

A para-type aromatic polyamide staple fibers are especially preferable as the aromatic polyamide staple fibers used in this invention. This is a staple fiber having 50 mole % or more of aromatic groups having the para-structure in the total amount of Ar$_1$ and Ar$_2$ in the above formula (I), and concretely, a paraphenylene terephthalamide staple fiber (Kevlar made by Du Pont Co., Ltd.), a copolyparaphenylene/3, 4'-oxydiphenylene terephthalamide Technora made by Teijin Limited), etc., are cited. Especially, the latter is excellent in electric insulating property and more preferable, since it contains only a small amount of impurity ions originated from a solvent used in the spinning process, Here, it is more preferable to fix a cation-exchangeable and non-ion-adsorbing solid state inorganic compound on the surface of the above copolyparaphenylene/3, 4'-oxydiphenylene terephthalamide staple fibers for improving the impregnating property thereof with a varnish composition and also having effects of reducing the amount of a deformation during the manufacturing process of the laminate for the electric circuit board and improving the electric insulating property and dimensional stability under a high temperature, since the adhesion property of the fibers with the varnish composition mediated by the above inorganic compound is also improved in the production process of the laminate for the electric circuit board, especially in the process of impregnating the varnish composition, especially an epoxy resin, etc.

As the above mentioned cation-exchangeable and non-ion-adsorbing inorganic compound which has a cation exchanging capability and also a nonionic substance absorbing capability, a silica/alumina, a silica/magnesia, a kaolin, an acid terra abla, an activated clay, a talc, a bentonite, an osmose, etc., are cited as concrete examples.

These compounds, especially fixed on the surface of the fibers as solid particles, are preferable, since the adhesion effect is further improved. As to the size of the particles, those having approximately 0.01 to 5.00 μm are used. Also, in order to fix the above inorganic compounds to the surface of the fibers, for example, the particles of the inorganic compound are preferably pushed to the surface of the fibers in a state that the fiber surfaces are softened, to make an inroad into the outermost surface layer part of the fibers.

Further, a part of the para-type aromatic polyamide staple fibers such as their terminals, may be fibrilated, but it is not preferable to have such a portion too much, since problems such as a non uniformity of the impregnation of the varnish composition and the reduction of the surface smoothness occur so as to prohibit the object of this invention.

Next, the meta-type aromatic polyamide staple fibers used in this invention are the staple fibers containing the aromatic groups having meta-structure in Ar$_1$ of 80 mole % or more and Ar$_2$ of 80 mole % or more in the above formula (I), and for example, staple fibers consisting of a homopolymer or a copolymer obtained by using one kind or two or more kinds of terephthalic acid, isophthalic acid, etc. as a dicarboxylic acid and one kind or two or more kinds of metaphenylenediamine, 4, 4'-diaminophenyl ether, 4,4-diaminodiphenylmethane, xylilenediamine, etc., as a diamine, are cited.

Their representative examples are staple fibers consisting of a polymetaphenylene isophthalamide, a polymetaxylene terephthalamide, or a copolymer obtained by copolymerizing isophthalic acid chloride, terephthalic acid chloride, metaphenylenediamine, etc., and among them an aromatic polyamide staple fibers of having 80 mole % or more, more preferably 90 mole % or more of the recurring unit of metaphenylene isophthalamide, are preferable.

And, as mentioned above, a part of the meta-type aromatic staple fibers may be fibrilated, but it is not preferable to have such a portion too much, since the object of this invention is prohibited by the reduction of the impregnating property of the varnish composition, etc.

In this invention, the above meta-type aromatic polyamide staple fibers and para-type aromatic polyamide staple fibers may be used as mixed and the ratio of mixing is to make preferably the meta-type polyamide staple fibers of 5 to 30% by weight and the para-type polyamide staple fibers of 70 to 95% by weight based on the total weight of the aromatic polyamide staple fibers.

That is, since among the above para-type aromatic polyamide fibers, there are some showing an elongating tendency in the fiber axis direction by heating, etc., for treatment to remove (dehumidification) its water content (moisture content), and among the above meta-type aromatic polyamide fibers, on the contrary, there are some showing a shrinking tendency in the fiber axis dieton under the similar condition, by combining both fibers skillfully, it is possible to obtain a heat resistant fiber sheet hardly showing a dimensional stability by repeating a washing with water and drying, and excellent in dimensional stability against a heat and dimensional stability against a humidity.

It is preferable to mix the above meta-type aromatic polyamide fibers at least 5% by weight, more preferably 8% by weight or more, but since in general the meta-type aromatic polyamide fibers have a higher equilibrium water content (water content) and a higher impurity ion content as compared with those of the para-type aromatic polyamide fibers, by increasing the mixing ratio of the meta-type aromatic polyamide fibers, there is a fear that the mixed fibers can not be used for the base substrate of the laminate for the electric circuit board which is required to have a high reliability for a long period of time, due to the decrease of the electric insulating property, especially the electric insulating property under a high temperature and a high humidity. Therefore, the amount occupied by the meta-type aromatic polyamide staple fibers is at most 30% by weight as a limit, and preferably 20% by weight or less.

As the staple fibers consisting of a heat resistant organic high molecular weight polymer other than the aromatic polyamide staple fibers, staple fibers consisting of an aromatic polymer containing heterocyclic ring such as a polyparaphenylene benzobisthazol, a polyparaphenylene benzobisoxazole, etc., or staple fibers consisting of a polyetherketone are cited.

As shown above, by adjusting the kinds or the mixing ratios of the used staple fibers consisting of the heat resistant organic high molecular weight polymers, it is possible to make the dimensional changing rate of the sheet against a heat by 0.3% or less, preferably 0.2% or less after a heat treatment at 280° C. for 5 minutes and control the maximum changing amount in the dimensional change of the sheet caused by the absorption or desorption of the moisture by 70 $\mu$m or less, preferably 55 $\mu$m or less, more preferably 40 $\mu$m or less measured by a method shown below, and it becomes possible to produce electric insulating materials or laminates for electric circuit boards extremely excellent in deformation (phenomena of distortion, curling, corrugation, etc.) resistance, dimensional stability against heat and dimensional stability against humidity by using such sheets.

Here, the amount of the dimensional change of the aromatic fiber sheet caused by the adsorption and desorption of moisture was measured by the following method. That is, the heat resistant sheet (length=20 mm, width=5 mm) is treated by leaving at a room temperature and under an atmosphere of a humidity of 85% RH or more for 48 hours or longer to sufficiently absorb moisture, performing a drying treatment by heating the sheet by elevating temperature from the room temperature to 300° C. at a temperature elevation rate of 10° C./minute, then cooling the sheet to the room temperature at a temperature lowering rate of 10° C./minute, and then successively repeating the temperature elevating and lowering between the room temperature and 300° C. under the same condition twice, and then the maximum changed amount (the maximum amount of elongation or the maximum amount of shrinkage) in the lengthwise direction is measured.

The individual fiber thickness of the staple fiber consisting of the above heat resistant organic high molecular polymer is preferably 0.1 to 10 deniers, more preferably 0.3 to 5.0 deniers. It is not preferable to use the individual fiber having the thickness of less than 0.1 denier, because a good quality fiber can not be produced, since there are many technically difficult points in fiber production such as the generation of breakage or of fibrillation and the cost thereof becomes high. On the other hand, if the individual fiber thickness is larger than 10 denier, it is not practical since the reduction in the mechanical properties of the fiber, especially in its strength, becomes too large.

Further, the fiber length of the staple fibers consisting of the heat resistant organic high molecular polymer is 0.5 to 80 mm, preferably 1 to 60 mm, particularly 2 to 12 mm, and further preferably 2.5 to 6 mm, in the case of forming the sheet by a wet production method. If the fiber length is less than 0.5 mm, the mechanical properties as a fiber aggregate of the obtained aromatic fiber sheet are apt to be insufficient. On the other hand, if the fiber length exceeds 80 mm, it is also not preferable since the opening property and dispersing property of the staple fibers are deteriorated to damage the uniformity of the obtained fiber aggregate and also the mechanical properties of the aggregate are apt to be insufficient.

Also, the fiber lengths in the case of mixing the staple fibers consisting of 2 kinds or more of the heat resistant organic high molecular polymers, are allowed to be the same, but desirably different from each other by at least 0.6 mm or longer, preferably 1.0 mm or longer. The reason of this is that the number of adhesion points between both of the individual fibers in the sheet increases in the case of having different staple fiber lengths of both of them as compared with the case of having the same staple fiber length of both of them, and especially, to improve the dimensional stability against heat in the thickness direction of the sheet. This effect is markedly exhibited especially in the case of mixing the meta-type aromatic polyamide staple fibers with the para-type aromatic polyamide staple fibers.

Next, the fibrids consisting of the organic high molecular weight polymer used in this invention is a thin leaf or scaly pieces having very small fibrils or randomly fibrilated very small staple fibers, having an equilibrium water content of 7.5% or less and acting as a binder during a wet type paper making process, and for example, as described in Japanese Patent Publications No. 35-11851, No. 37-5732, etc., fibrids produced by mixing an organic high molecular polymer solution in a system in which a precipitating agent for the organic high molecular polymer solution and a shearing force are present, also as described in Japanese Patent Publication No. 59-603, fibrids produced by applying a mechanical shearing force such as a beating to a formed material formed from a high molecular polymer solution exhibiting an optical anisotropy for randomly fibrilating, are cited, and among them the fibrids obtained by the former method is the most suitable.

As the organic high molecular polymer for this purpose, any of a heat resistant organic high molecular polymers having a fiber or a film forming capability and also having 330° C. or higher thermal decomposition initiating temperature, can be used.

For example, an aromatic polyamide, a wholly aromatic polyester becoming a liquid crystal upon melting thereof an aromatic polymer containing a heterocyclic ring, etc., can be used, but among them, especially, a copolyparaphenylene/3,4'-oxydiphenylene terephthalamide (Technora; made by Teijin Limited) having less impurity ion content, a wholly aromatic polyester becoming a liquid crystal upon melting thereof and consisting of a copolymer of p-hydroxybenzoic acid and 2,6'-hydroxynaphthoeic acid (Vectran; made by Kuraray K. K.) and the previously mentioned polyparaphenylene benzobisoxazole (PBO; made by Toyobo K. K.) in the case that the heat resistance is required, are preferable.

Ratios occupied by the fibrids consisting of the above organic high molecular polymers in the heat resistant fiber sheet are in the range of 3 to 60% by weight, preferably 4 to 45% by weight, and more preferably 5 to 30% by weight. In the case of setting the mixing ratio of the fibrids at a relatively low value, it is preferable to use the fibrids obtained for example by the production method described in Japanese Patent Publication No. 35-11851, No. 37-5732, etc., and in the case of setting the mixing ratio at a relatively high value, it is preferable to use the fibrids produced by using the method described in Japanese Patent Publication No. 59-603, and also the fibrids produced by both of the production methods can be used by mixing them.

By mixing the fibrids in a mixing ratio of less than 3% by weight, a tensile strength necessary for the paper formation during the wet-type paper making process, can not be maintained, and on the other hand if the ratio exceeds 60% by weight, the bulk density of the obtained aromatic fiber sheet becomes too high and prohibits the impregnating property of the varnish composition Also, similarly to the cases of the previously mentioned staple fibers, since there are fibrids elongating or shrinking by a dehydration (dehumidification) treatment of the water content (moisture), among the fibrids consisting of the organic high molecular polymers, by mixing both of them skillfully, the heat resistant fiber sheet hardly changing its dimension by repeating washing with water and drying and showing excellent dimensional stability against heat and dimensional stability against humidity can be obtained, and two or more kinds of fibrids are allowed to be used by mixing them.

Also, the fibrids consisting of the above organic high molecular polymer act as a binder for bonding among the staple fibers during the wet-type paper making process, but since the bonding force (adhesion force) is inferior to those of thermosetting resins such as, for example, an epoxy resin, a phenolic resin, a polyurethane resin, a melamine resin, etc., it is allowed to add a small amount of a water dispersion type binder consisting of such a thermosetting resin for improving the paper making performance in the wet-type paper making process.

Especially, the binder using an epoxy-based water dispersible resin having an epoxy functional group in its molecule, is the most suitable, since it has a good compatibility with the varnish composition used in the prepreg process.

The ratio occupied by the above binder in the aromatic fiber sheet in this invention, is preferably less than ⅓ of the weight of the fibrids consisting of the above organic high molecular polymer and more preferably in a range of ¼ thereof or less. If the ratio of the binder exceeds ⅓ of the weight of the fibrids, the fibrids can not suppress the migration of the resin during the wet-type paper making process, an adhesion force between layers of the surface and back sides and the middle layer portion becomes uneven, and there are cases of reducing the uniformity of the orientation and the fiber density distribution of the staple fibers in the middle layer portion of the paper during a calender process thereafter.

Further, it is preferable to mix for example, a glass fiber, a ceramic fiber, etc., into the heat resistant fiber sheet of this invention in a range of not damaging the object of this invention.

In the laminate for the electric circuit board, the characteristic properties such as dimensional stability against heat, dimensional stability against a humid heat, deformation resistance (phenomena such as distortion, curling, corrugation, etc.), etc., of the base substrate of the laminate, that is, the sheet, became important items and these characteristic properties are affected by the items such as bulk density, tensile strength, interlaminar peeling strength, etc.

Therefore, it is preferable that the heat resistant fiber sheet of this invention has a bulk density in a range of 0.45 to 1.13 g/cm$^3$, preferably 0.05 to 0.88 g/cm$^3$, more preferably 0.55 to 0.75 g/cm$^3$. If the bulk density is less than 0.45 g/cm$^3$, there are cases that the adhesion force among the staple fibers each other in the middle layer portion of the paper is reduced to make the impregnated amount of the varnish composition into the inside of the paper too much for generating a partial transfer of the staple fibers caused by the flow of the impregnated varnish in the production process of the prepreg and the production process of the laminates for the electric circuit board, especially in the laminate pressing process, and also generating a density irregularity of the fibers at the inside of the obtained laminate for the electric circuit board for inviting the reduction of the dimensional stability against heat and the deformation resistance thereof.

On the other hand, if the above bulk density exceeds 1.13 g/cm$^3$, it is not preferable since there are cases that the impregnation of the vanish composition into the inside of the paper becomes almost none to reduce the electric insulating property, dimensional stability against heat and deformation resistance.

Also, it is preferable that the tensile strength of the heat resistant fiber sheet of this invention is 1.5 kg/15 mm or higher, preferably 2.5 kg/15 mm or higher and more preferably 3.5 kg/15 mm or higher, and that the interlaminar peeling strength thereof is 12 g/15 mm or higher, preferably 15 g/15 mm or higher and more preferably 20 g/15 mm or higher.

If the above interlaminar peeling strength is less than 12 g/15 mm, there are cases that the adhesion force among the staple fibers each other in the middle portion of the sheet is reduced and the amount of impregnation of the varnish composition into the inside of the sheet becomes too much, a partial transfer of the staple fibers is generated, which is caused by the flow of the impregnated varnish in the production processes of the prepreg and the laminate for the electric circuit board, especially in the laminate compression process, and the density irregularity of the fibers is generated at the inside of the obtained laminate for the electric circuit board causing the reduction of the dimensional stability against heat and the deformation resistance.

On the other hand, if the tensile strength becomes less than 1.5 kg/15 mm, there is a tendency of easily generating the scission of the paper in the impregnation process of the varnish composition.

The above heat resistant fiber sheet can be produced by a wet paper making method, for example, it is obtained by weighing and mixing the staple fibers consisting of the heat resistant organic high molecular polymer and the fibrids consisting of the heat resistant organic high molecular polymer so as to make the concentration of the staple fibers as approximately 0.15 to 0.35% by weight, putting the staple fibers and the fibrids into water, uniformly dispersing to prepare an aqueous slurry, adding a dispersing agent and a viscosity adjusting agent as necessary into the slurry, then forming a wet paper by a wet paper making method using a paper making machine such as a long net type or a round net type machine, imparting an organic binder resin to the wet paper by a spraying method, etc., as necessary, drying to obtain the dried paper, heating and pressing the dried paper so as to make the above mentioned bulk density by partially softening and/or melting the fibrids.

In the case of performing the above heating and pressing with a calendering machine, it is preferable to do it between a hard-surfaced roll having a diameter of approximately 15 to 80 cm and a surface deformable elastic roll having a diameter of approximately 20 to 80 cm, preferably between two hard surface rolls having diameters of 20 to 80 cm. At that time, it is preferable to heat the rolls in a temperature range of 220 to 400° C., more preferably 250 to 350° C., and further more preferably 280 to 330° C. in order to soften or partially melt the fibrids consisting of the organic high molecular polymer for sufficiently exhibiting the function as the binder.

Also, as to the pressure, it is preferable to press at a linear pressure of 150 to 250 kg/cm, more preferably at 180 to 250 kg/cm.

Also, the above calendering process may be performed by a one step treatment, but in order to obtain a paper having more uniform quality in the thickness direction, it is preferable to adopt a two step-treatment in which a preliminary heating and pressing treatment is performed.

If the conditions of the heating and pressing treatment are out of the above temperature range and the above pressure range, the fibrids consisting of the organic high molecular polymer can not sufficiently exhibit the function as the binder resulting that the bulk density of the obtained heat resistant fiber sheet becomes less than 0.45 g/cm$^3$ or exceeds 1.13 g/cm$^3$, the tensile strength of the obtained aromatic fiber sheet becomes less than 1.5 kg/15 mm and the interlaminar peeling strength becomes less than 12 g/15 mm.

Further, the heat resistant fiber sheet obtained by performing the heating and pressing treatment under the above conditions, shows a thermal dimensional change rate of 0.30% or less after the thermal treatment at 280° C. for 5 minutes, and is excellent in the dimensional stability against heat, also low in equilibrium water content and used suitably for the laminate for the electric circuit board.

[Effect of the Invention]

A uniform laminate can be obtained by using the heat resistant fiber sheet of this invention, since it has a high tensile strength and a high interlaminar peeling strength in spite of having a low bulk density because the fine fibrids act as a binder, its dimensional changes in the thickness direction and surface direction of the sheet against a heat, and a temperature with a humidity are small also the occurrence of the scission of the paper substrate in the resin impregnation process, etc., is less, the impregnating property with a resin such as a varnish composition is good and the partial transfer of the staple fibers is less in the press-forming process of the laminates.

In other words, in this invention;

(I) Since the migration of the organic resin binder in the drying process of the sheet making is suppressed, the uneven distribution of the resin binder is moderated to improve the uniformity in the thickness direction of the sheet.

(2) In the calendering treatment process for bonding among the staple fibers, the fibrids consisting of the partially softened and/or melted organic high molecular polymer, suppresses the mutual transfer of the staple fibers to prevent the orientation of the staple fibers from a disorder.

(3) The filling among the staple fibers by the fibrids is less, and the impregnation property with the resin is good.

By a synergistic effect of the above actions, the staple fiber density and the fiber orientation in the cross sectional direction and surface direction of the sheet become uniform and the dimensional ages and deformations thereof do not tend to occur.

EXAMPLES

This invention is concretely described by examples as follows, but this invention is by no means limited by these examples. Further, the measuring methods used in the examples are as follows.

(1) Bulk Density

The bulk densities were measured by a method in accordance with Japanese Industrial Standard (JIS) C-2111 Section 6.1.

(2) Tensile Strength

The tensile strengths were measured by a method in accordance with JIS C-2111 Section 7 by using a constant stretching rate type tensile tester.

(3) Interlaminar Peeling Strength

The strengths (g/15 mm) in peeling the middle layer portion of specimens having a length of 200 mm and a width of 15 mm by using a T-peeling method, were measured by using the constant stretching rate type tensile tester.

(4) Dimensional Change Rate Against Heat

By using a high accuracy two dimensional coordinates measuring machine (made by Mutoh Kogyo K. K.), the longitudinal lengths of specimens having a length of 300 mm and a width of 50 mm before the heat treatment and after the heat treatment at 280° C. for 5 minutes were measured, and the dimensional stability rates against heat were calculated by using the following equation. Further, the specimens for the measurements were collected from both the longitudinal direction and the width direction, and the rates were compared by taking mean values of the results of the measurements of them.

Dimensional stability rate against heat (%)={(Length before the heat treatment−Length after the heat treatment)/ Length before the heat treatment} ×100

(5) Equilibrium Water Content

The equilibrium water contents of the staple fibers, the fibrids and the fiber sheets were obtained in accordance with JIS L-1013, by completely drying the specimens in an atmosphere of 120° C., equilibrating in an atmosphere at a temperature of 20° C. and at a relative humidity of 65% RH for 72 hours, measuring the water content contained in the specimens, calculating the ratios based on the weights of the specimens in the completely dried state and expressing by percentages (%).

Further, in the case that the specimen contained two or more kinds of staple fibers or fibrids, the equilibrium water content of each of the constituting components was independently measured and the equilibrium water content of the mixed specimen was expressed by a weight averaged value of the components in accordance with its mixing ratio.

(6) Evaluation of Dimensional Stability Against a Temperature With a Humidity (Moisture Absorption and Desorption)

The values were measured by using a thermal analysis unit (TMA; thermoflex type made by Rigaku Denki K. K.) at an initial specimen distance of 200 mm between the chucks of the unit, a width of 5 mm and at a temperature elevating and lowering rate of 10° C./minute. Further, the specimens for the measurements were kept in an atmosphere at a room temperature and a relative humidity of 85% RH or higher for 48 hours or longer for sufficiently absorbing moisture, and then used. The comparative judgment of the dimensional stabilities against the temperature with humidity were performed by drawing the loci of dimensional changes in cases of repeating the elevating and lowering temperature in a range from the room temperature to 300° C., comparatively observing the loci of the dimensional changes at the temperature elevation and the temperature lowering period for the initial time and for the second time or later, and measuring the maximum different value (maximum change value=maximum elongation value or maximum shrinkage value) of the dimensional change loci at the before and after the temperature elevating operations or during the temperature elevating or lowering operation for judging the suitability of the specimen by the magnitude thereof. That is, it was judged that the smaller the different amount of dimensional change loci at the temperature elevation and lowering would be the more stable to the temperature and humidity changes and excellent in dimensional stability against heat and deformation resistance.

(7) Deformation of the Laminate

A prepreg at a B-stage having a volume containing ratio of a resin content of 55% is prepared by impregnating a varnish composition obtained by dissolving an epoxy resin composition obtained by blending dicyandiamide as a curing agent and 2-ethyl-4-methylimidazole as a curing accelerating agent with a high purity brominated bisphenol A type epoxy resin and an ortho-cresole novolak type epoxy resin with a mixed solution of methyl ethyl ketone and methylcellosolve and drying at a temperature of 110 to 120° C. for 10 minutes. The prepregs were laminated to the both sides of a copper foil having thickness of 18 µm, and then the other similar copper foils were laminated to the outsides thereof by performing a press under a reduced pressure at 170° C. and at 40 kg/cm for 50 minutes with a hot press for curing the resin to obtain a laminate for an electric circuit board, and a post curing treatment in a hot air dryer at a temperature of 200° C. for about 20 minutes.

The laminate for the electric circuit board was cut by 150 mm square, and a specimen for evaluation is prepared by removing the all of the copper foil at both surfaces equivalent to 110 mm square in the middle portion thereof by an etching and leaving the copper foil at both surfaces by 20 mm width from the edge of the laminate as a frame shape.

The maximum amounts of deformations (distorted amount or floated amount caused by a curling or a corrugation) based on the central portion of the laminates as a reference point, were measured after heat treating the partially etched laminates for the electric circuit board at a temperature of 260° C. for 10 minutes and set as the amounts of deformation.

(8) Insulation Resistance Value of the Laminate

By using the laminate for the electric circuit board before the etching of the copper foil prepared in the above section (7), a pattern of comb-shaped electrodes having an interval of 0.15 mm was formed on one of the surface thereof by an etching, and stored in an atmosphere at a temperature of 60° C. and at a humidity of 95% RH for 1000 hours while applying a direct current voltage of 35 V between the above comb-shaped electrodes. Next, after keeping the laminate having comb-shaped electrodes in an atmosphere at a temperature of 20° C. and at a relative humidity of 60% for 1 hour, the insulation resistance values were measured by applying a direct current voltage (35 to 90 V) between the comb-shaped electrodes for 60 seconds.

Example 1

A paper making slurry for having a fiber concentration of 0.15% by weight was prepared by suspending staple fibers of 95% by weight, consisting of copolyparaphenylene/3,4'-oxydiphenylene terephthalamide of which fiber surfaces were adhered with a talc of 0.5% by weight and an osmose of 0.1% by weight, having an individual fiber thickness of 1.5 denier, a fiber length of 3 mm and an equivalent water content of 4.1% (Technora: made by Teijin Limited) and fibrids of 5% by weight, consisting of copolyparaphenylene/3,4'-oxydiphenylene terephthalamide (made by Teijin Limited) into water by a pulper and adding a dispersing agent (YM-80; made by Matsumoto Yushi K. K.) so as to make a concentration of 0.02%.

Next, a fiber sheet was prepared by using a Tappi square type hand paper forming machine and the above paper forming slurry, pressing for a light dehydration and then drying for about 15 minutes in a hot air dryer at a temperature of 160° C. Further, a heat resistant fiber sheet having a unit weight of 72 g/m$^2$ was obtained by heating and pressing the above paper by using a calendering machine composed of a pair of hard-surfaced metallic rolls having diameters of 400 mm under the conditions of a temperature of 200° C. and a linear pressure of 160 kg/cm, then, again heating and pressing by using a high temperature high calendering machine composed of a pair of hard-surfaced metallic rolls having diameters of 500 mm under the conditions of a temperature of 320° C. and a linear pressure of 200 kg/cm to soften the fibrids consisting of the copolyparaphenylene/3,4'-oxydiphenylene terephthalamide for fixing the copolyparaphenylene/3,4'-oxydiphenylene terephthalamide staple fibers.

Examples 2 to 7, and Comparative Examples 1 to 2

A heat resistant fiber sheet was produced similarly to the Example 1 except for changing the mixing ratios of the staple fibers consisting of the copolyparaphenylene/3,4-oxydiphenylene terephthalamide with the fibrids consisting of the copolyparaphenylene/3,4-oxydiphenylene terephthalamide, in the Example 1 as shown in Table 1.

Example 8

A heat resistant fiber sheet was produced similarly to the Example 2 except for using fibrids consisting of a polyparaphenylene terephthalamide having an equilibrium water content of 5.4% (made by Koron Co., Ltd.) instead of the fibrids consisting of the copolyparaphenylene/3,4'-oxydiphenylene terephthalamide, in the Example 2.

Example 9

A heat resistant fiber sheet was produced similarly to the Example 2 except for using staple fibers consisting of a polyparaphenylene terephthalamide, having the thickness of an individual fiber of 1.42 denier and fiber length of 3 mm and an equilibrium water content of 1.5% (Kevlar; made by Du Pont Co., Ltd.) instead of the staple fibers consisting of the polyparaphenylene/3,4-oxydiphenylene terephthalamide, in the Example 2.

Example 10

A heat resistant fiber sheet was produced similarly to the Example 1 except for using staple fibers of 90% by weight, consisting of the polyparaphenylene terephthalamide, having the thickness of an individual fiber of 1.42 denier, a fiber cut length of 3 mm and an equilibrium water content of 1.5% (Kevlar; made by Du Pont Co., Ltd.) and fibrids of 10% by weight consisting of the polyparaphenylene terephthalamide having an equilibrium water content of 5.4% (made by Koron Co., Ltd.).

Example 11

A heat resistant fiber sheet was produced similarly to the Example 2 except for setting a mixing ratio of the fibrids consisting of the copolyparaphenylene/3,4-oxydiphenylene terephthalamide (made by Teijin Limited) as 5% by weight, and also imparting a water dispersible epoxy resin binder having a solid portion concentration of 10% by weight (made by Dainippon Inkikagakukogyo K. K.) so as to make the above resin component as 5% by weight with a spraying method, in the Example 2.

Examples 12 to 19, and Comparative Examples 3 to 6

A heat resistant fiber sheet was produced similarly to the Example 2 except for changing the heating and pressing conditions with the high calendering machine, in the Example 2 as shown in Table 1.

Example 20 to 23

A heat resistant fiber sheet was produced similarly to the Example 2 except for changing the fiber length of the aromatic polyamide staple fibers, in the Example 2 as shown in Table 1.

Example 24

A heat resistant fiber was produced similarly to the Example 1 except for using staple fibers consisting of copolyparaphenylene/3,4'-oxydiphenylene terephthalamide of 87% (96.7% by weight based on the total weight of the staple fibers) by weight, of which fiber surfaces were adhered with a talc of 0.5% by weight and an osmose of 0.1% by weight, having an individual fiber thickness of 1.5 denier, a fiber length of 3 mm and an equivalent water content of 1.8% (Technora: made by Teijin Limited), staple fibers consisting of a polymetaphenylene isophthalamide of 3% by weight (3.3% by weight based on the total weight of the staple fibers) and having the thickness of an individual fiber of 3.0 denier and the fiber length of 5 mm (Conex; made by Teijin Limited), and fibrids of 10% by weight, consisting of a copolyparaphenylene/3,4'-oxydiphenylene terephthalamide (made by Teijin Limited).

Examples 25 to 28

A heat resistant fiber sheet was produced similarly to the Example 24 except for changing the mixing ratio of the staple fibers consisting of the copolyparaphenylene/3,4'-oxydiphenylene isophthalamide with those consisting of the polymetaphenylene isophthalamide, in the Example 24, as shown in Table 1.

Example 29

A heat resistant fiber sheet was produced similarly to the Example 26 except for changing the fiber length of the staple fibers consisting of the polymetaphenylene isophthalamide to 3.4 mm, in the Example 26.

Example 30

A heat resistant fiber sheet was produced similarly to the Example 27 except for using staple fibers consisting of a polyparaphenylene benzobisoxazole instead of the staple fibers consisting of the polymetaphenylene isopthalamide in the Example 27.

Example 31

A heat resistant fiber sheet was produced similarly to the Example 27 except for using staple fibers consisting of a polyetheretherketone (made by Tejin Limited) instead of the staple fibers consisting of the polymetaphenylene isophthalamide, in the Example 27.

Example 32

A heat resistant fiber sheet was produced similarly to the Example 3 except for using fibrids consisting of a polymetaphenylene isophthalamide having an equilibrium water content of 7.2% instead of the fibrids consisting of the copolyparaphenylene/3,4'-oxydiphenylene terephthalamide, in the Example 3.

Example 33

A heat resistant fiber sheet was produced similarly to the Example 3 except for using fibrids consisting of a polymetaphenylene isophthalamide having an equilibrium water content of 0% (Vectran; made by Kuraray K. K.) instead of the fibrids consisting of the copolyparaphenylene/3,4'-oxydiphenylene terephthalamide, in the Example 3.

Example 34

A heat resistant fiber sheet was produced similarly to the Example 3 except for using fibrids consisting of a polyparaphenylene benzobisoxazole having an equilibrium water content of 4.0% instead of the fibrids consisting of the copolyparaphenylene/3,4'-oxydiphenylene terephthalamide, in the Example 3.

Example 35

A heat resistant fiber sheet was produced similarly to the Example 3 except for using fibrids of 7% by weight, having an equilibrium water content of 4.6% (Kevlar; made by Du Pont Co., Ltd) and fibrids of 8% by weight, consisting of a polyparaphenylene terephthalamide and having an equilibrium water content of 5.4% (made by Koron Co. Ltd.)

instead of the fibrids consisting of the copolyparaphenylene/3, 4'-oxydiphenylene terephthalamide in the Example 3.

Comparative Example 7

A heat resistant fiber sheet was produced similarly to the Example 2 except for not using the fibrids consisting of the copolyparaphenylene/3,4'-oxydiphenylene terephthalamide and imparting a bisphenol A-epichlorohydrin-type water dispersible epoxy resin binder (Dainippon Inkikagakukogyo K. K.) so as to make the content of the resin as 10% by weight with a spraying method, in the Example 2.

The production conditions for the obtained fiber sheets are shown in the Table 1, and the various characteristics evaluated by the previously mentioned measuring methods are shown in Table 2.

Further, prepregs were produced by impregnating the varnish composition according to the method described in the previously mentioned measuring methods by using the above fiber sheets, and results of measuring the amounts of the deformation and the insulation resistance values under a high temperature of the laminates for the electric circuit plate produced by using the same, are also shown in the Table 2.

TABLE 1

|  | Mixing ratio(%) | | Cut length of staple fiber (mm) | High calender conditions | |
|---|---|---|---|---|---|
|  | Staple fiber | Fibrid |  | Heating temperature (° C.) | Linear Pressure (kg/cm) |
| Comparative Example 1 | 98 | 2 | 3 | 320 | 200 |
| Example 1 | 95 | 5 | 3 | 320 | 200 |
| Example 2 | 90 | 10 | 3 | 320 | 200 |
| Example 3 | 85 | 15 | 3 | 320 | 200 |
| Example 4 | 75 | 25 | 3 | 320 | 200 |
| Example 5 | 65 | 35 | 3 | 320 | 200 |
| Example 6 | 50 | 50 | 3 | 320 | 200 |
| Example 7 | 40 | 60 | 3 | 320 | 200 |
| Comparative Example 2 | 35 | 65 | 3 | 320 | 200 |
| Example 8 | 90 | 10 | 3 | 320 | 200 |
| Example 9 | 90 | 10 | 3 | 320 | 200 |
| Example 10 | 90 | 10 | 3 | 320 | 200 |
| Example 11 | 90 | 5 | 3 | 320 | 200 |

TABLE 1-continued

|  | Mixing ratio(%) | | Cut length of staple fiber (mm) | High calender conditions | |
|---|---|---|---|---|---|
|  | Staple fiber | Fibrid |  | Heating temperature (° C.) | Linear Pressure (kg/cm) |
| Comparative Example 3 | 90 | 10 | 3 | 200 | 200 |
| Example 12 | 90 | 10 | 3 | 220 | 200 |
| Example 13 | 90 | 10 | 3 | 280 | 200 |
| Example 14 | 90 | 10 | 3 | 340 | 200 |
| Example 15 | 90 | 10 | 3 | 380 | 200 |
| Comparative Example 4 | 90 | 10 | 3 | 420 | 200 |
| Comparative Example 5 | 90 | 10 | 3 | 320 | 130 |
| Example 16 | 90 | 10 | 3 | 320 | 160 |
| Example 17 | 90 | 10 | 3 | 320 | 180 |
| Example 18 | 90 | 10 | 3 | 320 | 220 |
| Example 19 | 90 | 10 | 3 | 320 | 240 |
| Comparative Example 6 | 90 | 10 | 3 | 320 | 280 |
| Example 20 | 90 | 10 | 1.2 | 320 | 200 |
| Example 21 | 90 | 10 | 5 | 320 | 200 |
| Example 22 | 90 | 10 | 10 | 320 | 200 |
| Example 23 | 90 | 10 | 13 | 320 | 200 |
| Example 24 | 87/3 | 10 | 3/5 | 320 | 200 |
| Example 25 | 84/6 | 10 | 3/5 | 320 | 200 |
| Example 26 | 76/14 | 10 | 3/5 | 320 | 200 |
| Example 27 | 67/23 | 10 | 3/5 | 320 | 200 |
| Example 28 | 59/31 | 10 | 3/5 | 320 | 200 |
| Example 29 | 76/14 | 10 | 3/3.4 | 320 | 200 |
| Example 30 | 67/23 | 10 | 3 | 320 | 200 |
| Example 31 | 67/23 | 10 | 3 | 320 | 200 |
| Example 32 | 85 | 15 | 3 | 320 | 200 |
| Example 33 | 85 | 15 | 3 | 320 | 200 |
| Example 34 | 85 | 15 | 3 | 320 | 200 |
| Example 35 | 85 | 15 | 3 | 320 | 200 |
| Comparative Example 7 | 90 | 0 | 3 | 320 | 200 |

TABLE 2

|  | Characteristic properties of heat resistant fiber sheet | | | | | | Laminate for electric circuit board | |
|---|---|---|---|---|---|---|---|---|
|  | Bulk density g/cm$^3$ | Tensile strength kg/15 mm | Intralaminar peeling strength g/15 mm | Equilibrium water content % | Equilibrium water content % | Dimensional change by humidity absorption and desorption μm | Amount of deformation mm | Insulation resistance Ω/cm |
| Comparative Example 1 | 0.38 | 1.3 | 10.4 | 0.34 | 1.89 | 74 | 3.6 | $10^9$ |
| Example 1 | 0.51 | 4.4 | 30.7 | 0.06 | 1.93 | 31 | 2.6 | $10^{12}$ |
| Example 2 | 0.71 | 5.8 | 43.2 | 0.03 | 2.05 | 20 | 2.0 | $10^{12}$ |
| Example 3 | 0.77 | 6.7 | 45.8 | 0.02 | 2.16 | 15 | 1.7 | $10^{12}$ |
| Example 4 | 0.82 | 7.9 | 66.3 | 0.16 | 2.38 | 42 | 2.9 | $10^{10}$ |
| Example 5 | 0.95 | 8.3 | 62.4 | 0.19 | 2.63 | 53 | 3.2 | $10^9$ |
| Example 6 | 1.02 | 7.6 | 69.5 | 0.25 | 2.71 | 54 | 3.3 | $10^9$ |
| Example 7 | 1.13 | 11.2 | 83.2 | 0.29 | 2.95 | 69 | 3.4 | $10^9$ |
| Comparative Example 2 | 1.18 | 7.9 | 70.8 | 0.36 | 3.12 | 77 | 4.4 | $10^8$ |

TABLE 2-continued

| | Characteristic properties of heat resistant fiber sheet | | | | | Laminate for electric circuit board | |
|---|---|---|---|---|---|---|---|
| | Bulk density g/cm³ | Tensile strength kg/15 mm | Intralaminar peeling strength g/15 mm | Equilibrium water content % | Equilibrium water content % | Dimensional change by humidity absorption and desorption μm | Amount of deformation mm | Insulation resistance Ω/cm |
| Example 8 | 0.62 | 3.1 | 17.0 | 0.03 | 2.18 | 17 | 2.1 | $10^{11}$ |
| Example 9 | 0.67 | 5.4 | 34.8 | 0.01 | 1.77 | 15 | 1.8 | $10^{9}$ |
| Example 10 | 0.55 | 2.9 | 15.6 | 0.05 | 1.90 | 19 | 2.3 | $10^{9}$ |
| Example 11 | 0.58 | 4.8 | 14.2 | 0.06 | 2.08 | 34 | 2.5 | $10^{12}$ |
| Comparative Example 3 | 0.40 | 1.3 | 11.9 | 0.38 | 2.12 | 77 | 3.9 | $10^{9}$ |
| Example 12 | 0.48 | 1.8 | 14.4 | 0.19 | 2.10 | 62 | 3.3 | $10^{11}$ |
| Example 13 | 0.63 | 3.9 | 20.1 | 0.05 | 2.07 | 26 | 2.4 | $10^{12}$ |
| Example 14 | 0.79 | 7.8 | 45.7 | 0.02 | 2.03 | 24 | 2.3 | $10^{12}$ |
| Example 15 | 0.97 | 8.9 | 51.6 | 0.01 | 2.01 | 33 | 2.9 | $10^{12}$ |
| Comparative Example 4 | 1.19 | 9.9 | 60.2 | 0.02 | 2.00 | 58 | 3.7 | $10^{9}$ |
| Comparative Example 5 | 0.42 | 1.4 | 16.7 | 0.26 | 2.00 | 57 | 4.2 | $10^{9}$ |
| Example 16 | 0.49 | 3.4 | 23.9 | 0.06 | 2.08 | 32 | 2.6 | $10^{11}$ |
| Example 17 | 0.65 | 5.2 | 44.4 | 0.02 | 2.04 | 22 | 2.1 | $10^{12}$ |
| Example 18 | 0.72 | 6.3 | 44.6 | 0.01 | 2.01 | 28 | 2.2 | $10^{12}$ |
| Example 19 | 0.54 | 3.7 | 31.1 | 0.02 | 1.99 | 48 | 3.1 | $10^{12}$ |
| Comparative Example 6 | 1.43 | 1.6 | 20.6 | 0.04 | 1.96 | 71 | 3.9 | $10^{11}$ |
| Example 20 | 0.73 | 1.3 | 11.3 | 0.28 | 1.98 | 62 | 3.3 | $10^{11}$ |
| Example 21 | 0.65 | 4.5 | 31.7 | 0.01 | 2.06 | 15 | 1.7 | $10^{12}$ |
| Example 22 | 0.57 | 2.5 | 13.6 | 0.14 | 2.08 | 41 | 3.0 | $10^{11}$ |
| Example 23 | 0.40 | 1.3 | 9.8 | 0.21 | 2.15 | 69 | 3.4 | $10^{10}$ |
| Example 24 | 0.52 | 3.2 | 14.4 | 0.22 | 2.09 | 58 | 3.7 | $10^{10}$ |
| Example 25 | 0.73 | 6.2 | 43.8 | 0.01 | 2.13 | 12 | 1.5 | $10^{11}$ |
| Example 26 | 0.74 | 6.4 | 44.1 | 0.01 | 2.78 | 16 | 1.8 | $10^{11}$ |
| Example 27 | 0.78 | 7.3 | 60.4 | 0.03 | 2.24 | 19 | 1.8 | $10^{10}$ |
| Example 28 | 0.71 | 8.1 | 64.4 | 0.26 | 2.21 | 69 | 3.9 | $10^{8}$ |
| Example 29 | 0.46 | 2.2 | 13.9 | 0.22 | 2.03 | 66 | 3.3 | $10^{10}$ |
| Example 30 | 0.68 | 5.7 | 39.8 | 0.05 | 2.02 | 18 | 1.5 | $10^{12}$ |
| Example 31 | 0.69 | 5.8 | 38.7 | 0.02 | 2.07 | 15 | 1.4 | $10^{12}$ |
| Example 32 | 0.52 | 2.6 | 14.3 | 0.01 | 2.75 | 13 | 1.4 | $10^{12}$ |
| Example 33 | 0.69 | 5.5 | 41.6 | 0.06 | 1.64 | 24 | 1.7 | $10^{12}$ |
| Example 34 | 0.66 | 5.2 | 39.2 | 0.03 | 1.96 | 16 | 1.5 | $10^{12}$ |
| Example 35 | 0.58 | 2.9 | 16.7 | 0.02 | 2.29 | 16 | 1.9 | $10^{10}$ |
| Comparative Example 7 | 1.41 | 2.3 | 8.2 | 0.34 | 2.55 | 77 | 4.1 | $10^{11}$ |

POSSIBILITY OF INDUSTRIAL UTILIZATION

An aromatic fiber sheet in this invention is obtained by solving the problems of the heat resistant fiber sheets produced by using the conventional technology and used for the laminates for the electric circuit boards, especially reducing dimensional changes due to temperature and humidity changes and reducing water absorption rate (equilibrium water content) to improve electric insulation resistances, and the aromatic fiber sheet having a high tensile strength and an interlaminar peeling strength is obtained. Since the laminate for the electric circuit board produced by using the aromatic fiber sheet as its base substrate, does not practically generate distortion, curling and corrugation in its production process or in its use, a fine circuit design is possible, and it is an epoch making material since even loading an electronic part having a small expansion coefficient against temperature with humidity such as a leadless ceramic chip carrier, a bear chip, etc., directly by a solder, a high reliability is maintained for a long period of time, and especially, the aromatic fiber sheet of this invention is suitable for the laminates used for the electric circuit boards for uses requiring high degrees of light weight, dimensional stabilities and heat and moisture resistant electric insulation property.

What is claimed is:

1. A heat resistant staple fiber sheet, comprising:
   (A) 40 to 97% by weight of aromatic polyamide staple fibers comprising a blend of:
      (a) 5 to 30% by weight of meta-type aromatic polyamide staple fibers, and
      (b) 70 to 95% by weight of para-type aromatic polyamide staple fibers, wherein the fiber length of the meta-type aromatic polyamide staple fibers (a) is longer than the fiber length of the para-type aromatic polyamide staple fibers (b) by 0.6 mm or longer, and
   (B) 3 to 60% by weight of fibrids consisting of an aromatic polyamide polymer, and incorporated into the staple fibers (A),
   wherein said fibrids (B) act as a binder by being partially softened and/or melted.

2. The heat resistant staple fiber sheet as claimed in claim 3, wherein the para-type aromatic polyamide staple fibers are polyparaphenylene terephthalamide staple fibers and/or copoly(paraphenylene/3,4'-oxydiphenylene terephthalamide) staple fibers.

3. The heat resistant staple fiber sheet as claimed in claim 2, wherein the copoly(paraphenylene/3,4'-oxydiphenylene terephthalamide) staple fibers have solod, cation-exchangeable, non-ion-adsorbing inorganic compound particles fixed to the surfaces of the staple fibers.

4. The heat resistant staple fiber sheet as claimed in claim 1, wherein the meta-type aromatic polyamide staple fibers are poly(metaphenylene isophthalamide) staple fibers.

5. The heat resistant staple fiber sheet as claimed in claim 1, wherein the fibrids consisting of a heat resistant organic high molecular polymer are fibrids consisting of a polyparaphenylene terephthalamide and/or a copoly(paraphenylene/3,4'-oxydiphenylene terephthalamide).

6. The heat resistant staple fiber sheet as claimed in claim 1, wherein the staple fibers consisting of a heat resistant organic high molecular polymer have a fiber length in the range of from 2 to 12 mm.

7. The heat resistant staple fiber sheet as claimed in claim 1, wherein the heat resistant staple fiber sheet have a bulk density in the range of from 0.45 to 1.13 g/cm$^3$.

8. The heat resistant staple fiber sheet as claimed in claim 1, wherein the maximum amount of the dimensional change of the heat resistant staple fiber sheet measured by the following method is 70 $\mu$m or less.

9. The heat resistant staple fiber sheet as claimed in claim 1, wherein the dimensional change rate of the heat resistant staple fiber sheet in the longitudinal direction on heat-treating the sheet at 280° C. for 5 minutes is 0.30% or less.

10. The heat resistant staple fiber sheet as claimed in claim 1, wherein the tensile strength of the heat resistant staple fiber sheet is 1.5 kg/15 mm or higher, and the interlaminar peeling strength is 12 g/15 mm or higher.

11. The heat resistant staple fiber sheet as claimed in claim 1, wherein the staple fibers consisting of a heat resistant organic high molecular polymer are staple fibers consisting of an aromatic polymer containing a heterocyclic ring.

12. The heat resistant staple fiber sheet as claimed in claim 1, wherein the staple fibers consisting of a heat resistant organic high molecular polymer are staple fibers consisting of a polyetheretherketone.

13. The heat resistant staple fiber sheet as claimed in claim 1, wherein the fibrids consisting of a heat resistant organic high molecular polymer are the fibrids consisting of a wholly aromatic polyester becoming a liquid crystal upon melting thereof.

14. The heat resistant staple fiber sheet as claimed in claim 1, wherein the fibrids consisting of a heat resistant organic high molecular polymer are the fibrids consisting of an aromatic polymer containing a heterocyclic ring.

* * * * *